United States Patent [19]

Eltoukhy

[11] Patent Number: 5,572,476

[45] Date of Patent: Nov. 5, 1996

[54] APPARATUS AND METHOD FOR DETERMINING THE RESISTANCE OF ANTIFUSES IN AN ARRAY

[75] Inventor: Abdelshafy A. Eltoukhy, San Jose, Calif.

[73] Assignee: Actel Corporation, Sunnyvale, Calif.

[21] Appl. No.: 431,654

[22] Filed: May 2, 1995

Related U.S. Application Data

[63] Continuation of Ser. No. 255,160, Jun. 7, 1994, Pat. No. 5,469,396.

[51] Int. Cl.⁶ ................................................. G11C 17/16
[52] U.S. Cl. ...................... 365/210; 365/96; 365/225.7; 365/230.01; 257/50; 257/530
[58] Field of Search ............................. 365/96, 225.7, 365/210, 230.01; 257/50, 530

[56] References Cited

U.S. PATENT DOCUMENTS

| | | | |
|---|---|---|---|
| 4,255,748 | 3/1981 | Bartlett | 340/661 |
| 4,625,313 | 11/1986 | Springer | 371/20 |
| 4,638,243 | 1/1987 | Chan | 324/51 |
| 4,718,042 | 1/1988 | Moll et al. | 365/201 |
| 4,800,176 | 1/1989 | Kakumu et al. | 437/193 |
| 4,935,645 | 6/1990 | Lee | 307/362 |
| 5,008,855 | 4/1991 | Eltoukhy et al. | 365/96 |
| 5,126,282 | 6/1992 | Chiang et al. | 257/530 X |
| 5,272,388 | 12/1993 | Bakker | 307/202.1 |
| 5,293,133 | 3/1994 | Birkner et al. | 324/713 |
| 5,397,939 | 3/1995 | Gordon et al. | 365/96 X |
| 5,469,396 | 11/1995 | Eltoukhy | 365/210 |
| 5,526,312 | 6/1996 | Eltoukhy | 365/201 |

*Primary Examiner*—Do Hyun Yoo
*Attorney, Agent, or Firm*—D'Alessandro & Ritchie

[57] ABSTRACT

An additional column (or row) track is provided in an antifuse based interconnect array containing circuit structures identical to the circuit structures in the remaining columns of the array, except that antifuse vias are filled with contact or via plugs. These plug antifuse substitutes are addressable in the same manner and by the same circuitry as the antifuses on the integrated circuit. The programmed antifuse is addressed, a test voltage is placed on the $V_{pp}$ input pin on the integrated circuit, and the current drawn by the antifuse is measured. The plug antifuse substitute is addressed, the test voltage is placed on the $V_{pp}$ input pin on the integrated circuit, and the current drawn by the plug antifuse substitute is measured. The resistance of the entire circuit path which includes the programmed antifuse is calculated using the test voltage and the measured antifuse current and the resistance of the entire circuit path which includes the plug antifuse substitute is calculated using the test voltage and the measured plug antifuse substitute current. The difference between the two resistance values is an accurate measure of the resistance of the programmed antifuse.

3 Claims, 3 Drawing Sheets

APPARATUS AND METHOD FOR DETERMINING THE RESISTANCE OF ANTIFUSES IN AN ARRAY

RELATED APPLICATIONS

This is a continuation of patent application Ser. No. Ser. No. 08/255,160, filed Jun. 7, 1994, now U.S. Pat. No. 5,469,396.

BACKGROUND OF THE INVENTION

1. Field of the Invention

The present invention relates to antifuse technology. More particularly, the present invention relates to structures and methods for determining the resistance of antifuses disposed in a circuit containing an array of antifuses, such as a field programmable gate array product.

2. The Prior Art

In a typical integrated circuit containing an array of rows and columns of functional circuits, a user-programmable interconnect architecture usually comprises a network of rows and columns of interconnect conductors which may be selectively connected to one another and to inputs and outputs of the functional circuits by programming user-programmable antifuse elements. To program a selected antifuse element, that element is addressed by programming circuitry contained on the integrated circuit, and a programming voltage potential (usually designated as $V_{pp}$) is placed across the antifuse to create a low-impedance electrical path through it.

The selection of antifuses to program and the antifuse programming process are known in the art, but briefly, the programming potential $V_{pp}$ is usually supplied to an I/O pin of the integrated circuit. Information identifying a programming circuit path for the selected antifuse is provided to the integrated circuit, usually by clocking it as a serial bit stream into a serial shift register chain in the integrated circuit. After the antifuse-identifying information is clocked into the shift register it is used to steer the $V_{pp}$ potential and a reference potential (usually ground) to the selected antifuse by turning on one or more transistors which are sometimes referred to as pass transistors. An exemplary antifuse programming architecture is disclosed in U.S. Pat. No. 4,758,745 to El Gamal et al.

After antifuses in an integrated circuit have been programmed, it is advantageous to have the capability to determine the resistance of the programmed antifuses. Knowledge of the as-programmed resistance of an antifuse is useful for determining when to stop the programming procedure, for device design, process monitoring, binning (the sorting of devices according to speed performance) and other purposes.

Unfortunately, direct measurement of antifuse resistance is difficult, if not impossible. The antifuse to be measured is rarely, if ever, electrically located adjacent to any of the I/O pins of the integrated circuit, and the packaging provided over the integrated circuit die rules out the possibility of internally probing the integrated circuit to directly measure antifuse resistance.

Indirect measurements of antifuses have been made during the antifuse programming process by monitoring the current drawn from the programming voltage power supply. Examples of this technique are found in U.S. Pat. Nos. 5,008,855 to Eltoukhy et al. and 5,126,282 to Chiang et al. These methods give only an indirect measurement of the resistance of the antifuse itself, since the resistance of other elements in the programming path contribute to the total resistance which draws current from the programming voltage power supply during antifuse programming.

U.S. Pat. No. 5,293,133 to Birkner et al. discloses a method for determining antifuse resistance where a transistor is placed in parallel with an antifuse. Prior to programming the antifuse, the transistor is turned on and the current through the transistor is measured. This measurement allows calculation of the programming path resistance. After the antifuse is programmed, first the transistor is turned off and the current through the antifuse is measured. This measurement allows the resistance of the programming path including the antifuse to be measured. Then the transistor is turned on and the current through the parallel combination of the antifuse and the transistor in the programming path is measured.. This information allows determination of the individual resistances of the transistor, the antifuse, and the programming path.

While this scheme allows measurement of antifuse resistance, it is limited to circuit arrangements in which there is a transistor in parallel with the antifuse. In many practical circuit configurations employing antifuses, this circuit arrangement is not possible.

There exists a need for circuitry and a method for more accurately measuring antifuse resistance after the antifuse is programmed.

It is an object of the present invention to provide circuitry which may be disposed on an integrated circuit along with an antifuse array and which will allow the resistance of programmed antifuses to be measured more accurately than is possible in the prior art.

It is another object of the present invention to provide a method for measuring the resistance of programmed antifuses to be measured more accurately than is possible in the prior art.

BRIEF DESCRIPTION OF THE INVENTION

The present invention comprises structures and methods for determining the resistance of antifuses disposed in a circuit containing an array of antifuses, such as a field programmable gate array product. In a typical integrated circuit environment in which the present invention may function, a plurality of user-programmable antifuse elements are disposed in an integrated circuit in order to programmably connect selected circuit elements to one another via a network of interconnect conductors which may comprise metal lines or tracks disposed in one or more metal interconnect layers of the integrated circuit.

According to a presently preferred embodiment of the invention, an additional antifuse resistance measurement vertical (or horizontal) metal track is provided in a column (or row) in an antifuse based interconnect array. The circuit structures in the additional antifuse resistance measurement, including the programming transistors associated with the various different antifuses in the array, are identical to the circuit structures in the remaining tracks of the columns (or rows) of the array, except that the antifuse vias are masked during the antifuse formation step and are filled with contact or via plugs during the inter-metal contact step performed during the fabrication process. These plug antifuse substitutes are addressable in the same manner and by the same circuitry as the antifuses on the integrated circuit.

According to a presently preferred embodiment of a second aspect of the invention, a method is provided for determining the resistance of already-programmed antifuses on the integrated circuit containing the additional circuitry of the present invention. The programmed antifuse is addressed, a test voltage is placed on the $V_{pp}$ input pin on the integrated circuit, and the current drawn by the antifuse is measured. The plug antifuse substitute is addressed, the test voltage is placed on the $V_{pp}$ input pin on the integrated circuit, and the current drawn by the plug antifuse substitute is measured.

The resistance of the entire circuit path which includes the programmed antifuse is determined using the test voltage and the measured antifuse current. The resistance of the entire circuit path which includes the plug antifuse substitute is also determined using the test voltage and the measured plug antifuse substitute current. The resistance of the plug is negligible (i.e., about 1 ohm), and since the two circuit paths are substantially identical with the exception of the substitution of the plug for the antifuse, the difference between the two resistance values is an accurate measure of the resistance of the programmed antifuse.

According to a variation of the method according to the present invention, the resistance of an individual metal column (or row) track in an integrated circuit containing the structure of the present invention may be accurately measured. The resistance of the programming path to a first plug located at one end of the column or row line is determined using the above-described technique and then the resistance of the programming path to a second plug located at one end of the column or row track is determined in the same manner. The difference between the resistances of the two programming paths is an accurate measurement of the resistance of the metal column or row track.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

Figure 1:
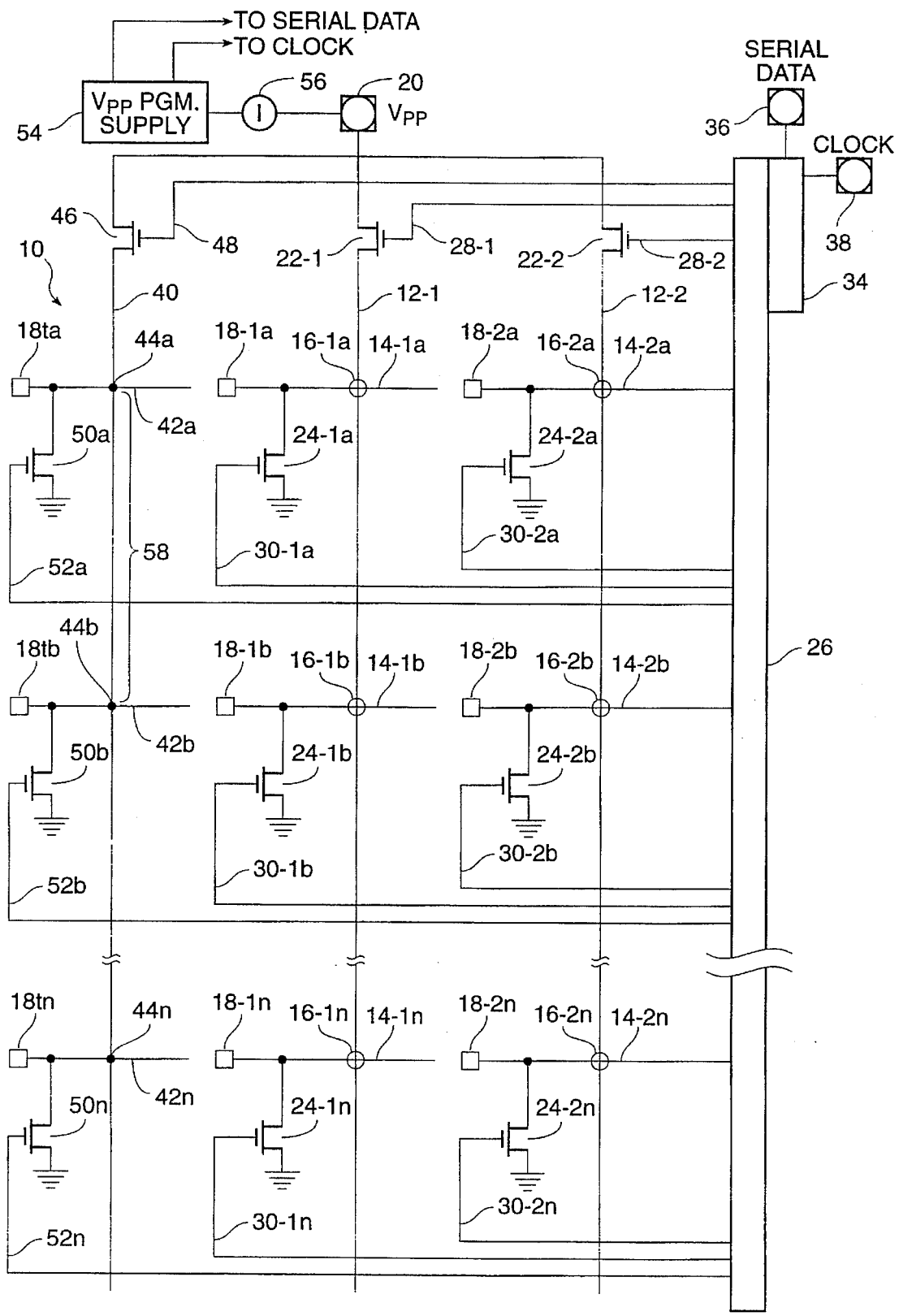
FIG. 1 is a simplified block/schematic diagram of a portion of a typical architecture of an antifuse array programmable integrated circuit including the circuitry of the present invention.

Referring first to FIG. 1, a simplified block/schematic diagram of a typical antifuse array product containing the circuitry of the present invention is presented. Antifuse array 10 includes a network of interconnect conductors which may be connected to one another by antifuses.

Examining FIG. 1 in more detail, a first column interconnect conductor (also referred to herein as a "track") 12-1 is disposed within the array. Column interconnect conductor 12-1 may be connected to additional interconnect conductors by programming antifuses associated with it and the other interconnect conductors. As illustrated in FIG. 1, column interconnect conductor 12-1 may be connected to interconnect conductor 14-1a by programming antifuse 16-1a connected between them. In similar fashion, column interconnect conductor 12-2 may be connected to interconnect conductor 14-2a by programming antifuse 16-2a connected between them. For purposes of this disclosure, it will be assumed that antifuses 16-1a and 16-2a are each physically located near a first end of their respective column interconnect conductors 12-1 and 12-2.

Other antifuses may be used to connect column interconnect conductors 12-1 and 12-2 to other interconnect conductors. Column interconnect conductor 12-1 may be connected to interconnect conductor 14-1b by programming antifuse 16-1b and column interconnect conductor 12-2 may be connected to interconnect conductor 14-2b by programming antifuse 16-2b. Finally, as shown in FIG. 1, column interconnect conductor 12-1 may be connected to interconnect conductor 14-1n by programming antifuse 16-1n and column interconnect conductor 12-2 may be connected to interconnect conductor 14-2n by programming antifuse 16-2n. For purposes of this disclosure, it will be assumed that antifuses 16-1n and 16-2n are each physically located near a second end of their respective column interconnect conductors 12-1 and 12-2.

Those of ordinary skill in the art will also understand that antifuse array 10 also includes functional circuitry in blocks or modules which may be connected to one another by using the antifuse interconnection architecture just described. Such circuitry is shown diagrammatically as circuit blocks 18-1a through 18-1n and 18-2a through 18-2n. Those of ordinary skill in the art will understand that, for the purposes of the present invention, circuit blocks 18-1a through 18-1n and 18-2a through 18-2n may contain any kind of digital or analog circuitry. Those of ordinary skill in the art will recognize that antifuse array 10 may be of an arbitrary size and therefore that n may be an integer dictated solely by design choice.

The scheme for programming the antifuses in the antifuse array 10 is known in the art. Briefly, an antifuse may be programmed by placing a programming voltage potential (designated as $V_{pp}$) across it to rupture a layer of antifuse material separating its two conductive electrodes. The $V_{pp}$ potential is usually supplied from off of the integrated circuit and presented to an I/O pin 20 of the integrated circuit. Steering or pass transistors are used to present the programming potential to the antifuses. Transistors 22-1 and 22-2 are used to supply the $V_{pp}$ potential to column interconnect conductors 12-1 and 12-2, respectively. Transistors 24-1a, 24-1b, and 24-1n are used to supply ground potential to interconnect conductors 14-1a, 14-1b, and 14-1n, respectively. Transistors 24-2a, 24-2b, and 24-2n are used to supply ground potential to interconnect conductors 14-2a, 14-2b, and 14-2n, respectively.

As an example of antifuse programming in the architecture of FIG. 1, to program antifuse 16-1a, the $V_{pp}$ potential is placed on the one of its conductive electrodes connected to column interconnect conductor 12-1 by turning on transistor 22-1. Ground potential is placed on the other one of its electrodes by turning on transistor 24-1a. Thus, the entire $V_{pp}$ potential is placed across antifuse 16-1a.

Transistors 22-1, 22-2, 24-1a, 24-1b, 24-1n, 24-2a, 24-2b, and 24-2n are controlled by gate control circuit 26, which provides sufficient gate voltage to completely turn on the transistors. In the simplified diagram of FIG. 1, gate line 28-1 drives the gate of transistor 22-1 and gate line 28-2 drives the gate of transistor 22-2. Gate lines 30-1a through 30-1n and 30-2a through 30-2n drive the gates of their respective transistors 24-1a, 24-1b, 24-1n, 24-2a, 24-2b, and 24-2n.

Gate control circuit 26 is driven from serial shift register chain 34. Serial data identifying the antifuse to be programmed is shifted into serial shift register chain 34 from its input I/O pin 36 under control of a serial shift register clock signal presented to clock I/O pin 38, The data in serial shift register chain 34 is appropriately decoded and used by gate control circuit 26 to turn on the transistors by biasing their gate lines.

According to the present invention, accurate antifuse resistance measurement is made possible by providing an extra column in antifuse array 10. As shown in the left-hand portion of FIG. 1, measurement column conductor 40 intersects interconnect conductors 42a, 42b, and 42n. The geometries and physical layout of measurement column conductor 40 and interconnect conductors 42a, 42b, and 42n are identical to the layouts of the other columns in array 10 which were previously described herein.

However, instead of antifuses being located at the intersections of measurement column conductor 40 and interconnect conductors 42a, 42b, and 42n, via plugs 44a, 44b, and 44n are formed in their place. Those of ordinary skill in the art will recognize that the via plugs 44a, 44b, and 44n may be formed using the same mask set used to fabricate the antifuse array 10, since the via apertures are usually formed along with the antifuse apertures and will have the same geometries, making layout of the measurement column conductor 40 of the present invention a straightforward task, since the layout designer already has the structures available from the main design of the array 10. The masks are altered to mask the apertures for via plugs 44a, 44b, and 44n during formation of the antifuse material and are exposed during the via plug step used for metal layer interconnect.

Transistor 46 is used to selectively supply the $V_{pp}$ potential to measurement column conductor 40 under the control of gate line 48 driven by gate control circuit 26. Transistors 50a, 50b, and 50n are used to supply ground potential to interconnect conductors 42a, 42b, and 42n, respectively, under the control of gate lines 52a, 52b, and 52n, respectively, driven by gate control circuit 26. Transistor 46 will be sized and positioned identically to transistors 22-1 and 22-2, and transistors 50a, 50b, and 50n will be sized and positioned identically to transistors 24-1a, 24-1b, 24-1n, 24-2a, 24-2b, and 24-2n.

Finally, extra test circuit blocks 18ta, 18tb, and 18tn, identical to circuit blocks 18-1a, 18-1b, 18-1n, 18-2a, 18-2b, and 18-2n, are connected to interconnect conductors 42a, 42b, and 42n in the same geometry as circuit blocks 18-1a, 18-1b, 18-1n, 18-2a, 18-2b, and 18-2n. These test circuit blocks may be used for binning as is known in the art, but also serve to make the circuit networks of the measurement column of the present invention electrically equivalent to the normal array columns in the integrated circuit.

The resistance of the via plugs 44a, 44b, and 44n in the finished integrated circuit will be about 1 ohm. This characteristic of via plugs 44a, 44b, and 44n, in combination with the identical layout and geometry between the elements of the measurement column and the elements of the array columns allows accurate measurements to be made of the resistance of the antifuses in the antifuse array 10.

The functioning of the circuitry and method of the present invention may be easily understood using the previous example of programming antifuse 16-1a. As previously described, the $V_{pp}$ potential is placed on the one of conductive electrodes of antifuse 16-1a connected to interconnect conductor 12-1 by turning on transistor 22-1. Ground potential is placed on the other one of its electrodes by turning on transistor 24-1a. Thus, the entire $V_{pp}$ potential is placed across antifuse 16-1a.

$V_{pp}$ programming unit 54 is used to supply the $V_{pp}$ programming potential to I/O pin 20 of the integrated circuit containing the antifuse array 10. As will be understood by those of ordinary skill in the art, $V_{pp}$ programming unit 54 will usually be a commercially available computer-controlled programming device and will thus also supply the serial data and clock signals to I/O pins 36 and 38 to select the antifuses to be programmed during an antifuse programming sequence as is known in the art. A current measurement may be made during programming, as indicated symbolically by ammeter 56, to determine when the selected antifuse is sufficiently programmed to terminate the programming sequence and advance to the next antifuse to be programmed.

According to the present invention, during the programming sequence for each integrated circuit, $V_{pp}$ programming unit 54 may be conditioned to "program" (i.e., apply $V_{pp}$ across the current path containing) one of via plugs 44a, 44b, and 44n in the measurement column which corresponds to an antifuse in the regular array which is selected for programming. More likely, all of the via plugs 44a, 44b, and 44n will be sequentially selected for a "programming sequence in which their transistors are turned on and $V_{pp}$ is applied across the selected plug via.

The current drawn during the "programming" sequence for each via plug is measured and stored in a table. The $V_{pp}$ programming unit 54 also measures and stores the current drawn from the $V_{pp}$ potential when the ones of the actual antifuses in the antifuse array 10 are selected for programming. The results of these measurements makes possible a very accurate determination of antifuse resistance according to the present invention. Alternatively, those of ordinary skill in the art will recognize that these measurements may be made "on the fly" without the need for an intermediate step used to store the measured currents for later evaluation.

As previously noted, the resistance of each of the via plugs 44a, 44b, and 44n will be about 1 ohm. Those of ordinary skill in the art will recognize that the number of transistors in any given programming path will be dictated by the particular implementation of the architecture, but will usually be at least two. Further, the on resistance of each transistor in the programming path varies but may be considered to be nominally about 80 ohms. Similarly, the resistance of a programmed antifuse may be expected to be in the range of about 20 ohms to about 1000 ohms.

Because the measurement track and the remainder of the actual tracks of the antifuse array 10 are disposed on the same integrated circuit die, the circuit path to any via plug in the measurement track will electrically equivalent to the circuit path to any corresponding antifuse in the remainder of the array, the sole difference being the 1 ohm exhibited by the via plug in place of the resistance of the antifuse to be measured. Given the magnitude of the total resistance of the remainder of circuit elements in the measurement track circuit path, the 1 ohm resistance of the via plug can be ignored as a practical matter, and the resistance of the antifuse to be measured is directly proportional to the difference in the measured current in the measurement column and the measured current in the column containing the programmed antifuse. The antifuse resistance $R_{af}$ can be expressed as:

$$R_{af} = (V_{pp}/I_{ppaf}) - (V_{pp}/I_{ppvia})$$

where $I_{ppaf}$ is the current measured during programming of the antifuse and $I_{ppvia}$ is the current measured while applying $V_{pp}$ to the current path including the via plug.

Figure 2:
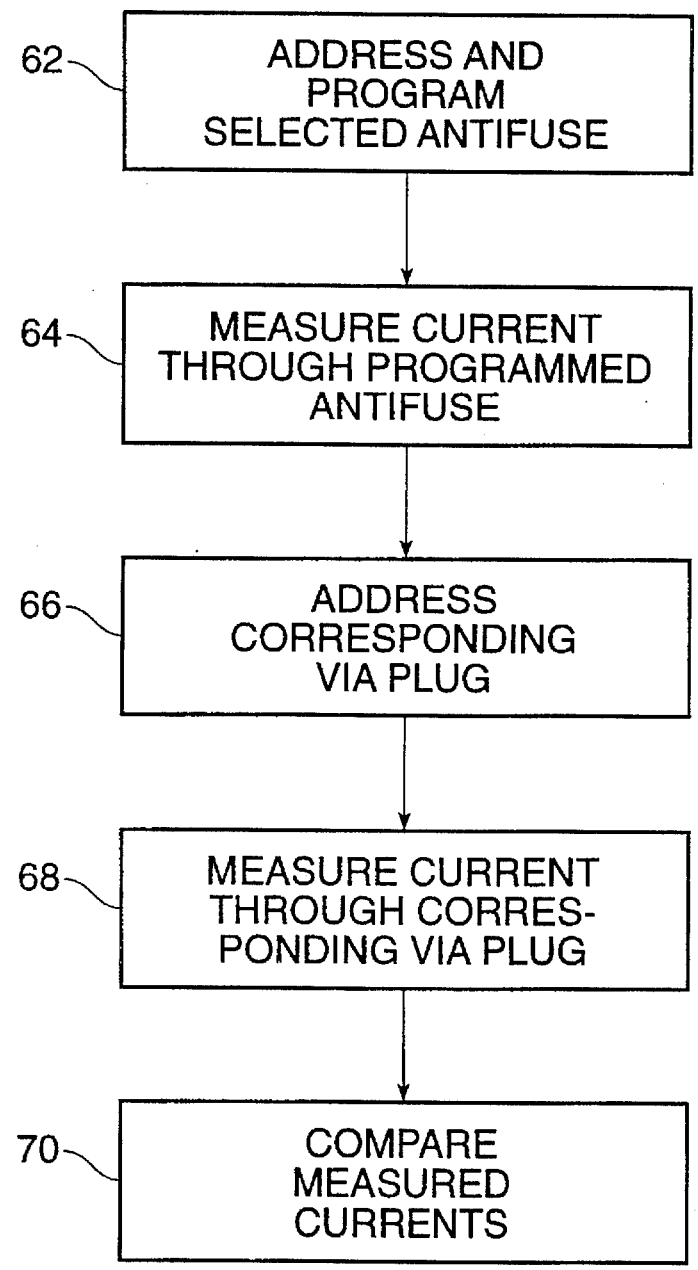
FIG. 2 is a flow diagram of a method for determining antifuse resistance according to the present invention.

Referring now to FIG. 2, a flow diagram for the antifuse resistance measurement method of the present invention is presented. First, at step 62, the selected antifuse is addressed by turning on the appropriate programming transistors. The selected antifuse is then programmed. After the antifuse has been programmed, the current drawn from the $V_{pp}$ power supply is measured at step 64 using either $V_{pp}$ or another selected voltage. At step 66, the via plug structure corresponding to the just-programmed antifuse is addressed and either $V_{pp}$ or the other selected voltage is applied. Next, at step 68, the current flowing through the selected corresponding via plug is measured. Finally, at step 70, the two measured currents are compared in order to determine the resistance of the programmed antifuse.

Those of ordinary skill in the an will readily recognize a variation of the sequence of the method described with reference to FIG. 2 wherein all of the via plugs on an integrated circuit are addressed, the currents flowing through them are measured, and the results are stored in a table. As corresponding antifuses are programmed, the table may be accessed to provide the reference currents which were measured flowing through the via plug structures.

The location of a particular antifuse in the array may cause a minor variation in the measured resistance due to metal line resistance. This may introduce some error in the calculation. The principles of them present invention may be used to solve this problem.

Referring again to FIG. 1, a method is disclosed according to the present invention for accurately measuring the resistance of all or a part of any one of column interconnect conductor 12-1 or 12-2. For example, if $V_{pp}$ programming unit 54 is conditioned to "program" both via plugs 44a and 44b, the difference in resistance measurements obtained should be equal to the resistance of the segment 58 of measurement column conductor 40. Since the same lithography patterns and definition process steps were used to form the corresponding segments of column interconnect conductors 12-1 and 12-2 located between antifuses 14-1a and 14-1b and 14-2a and 14-2b, respectively, the measured resistance of segment 58 of measurement column conductor 40 should be the same or extremely close to the resistance of the corresponding segments of column interconnect conductors 12-1 and 12-2.

Figure 3:
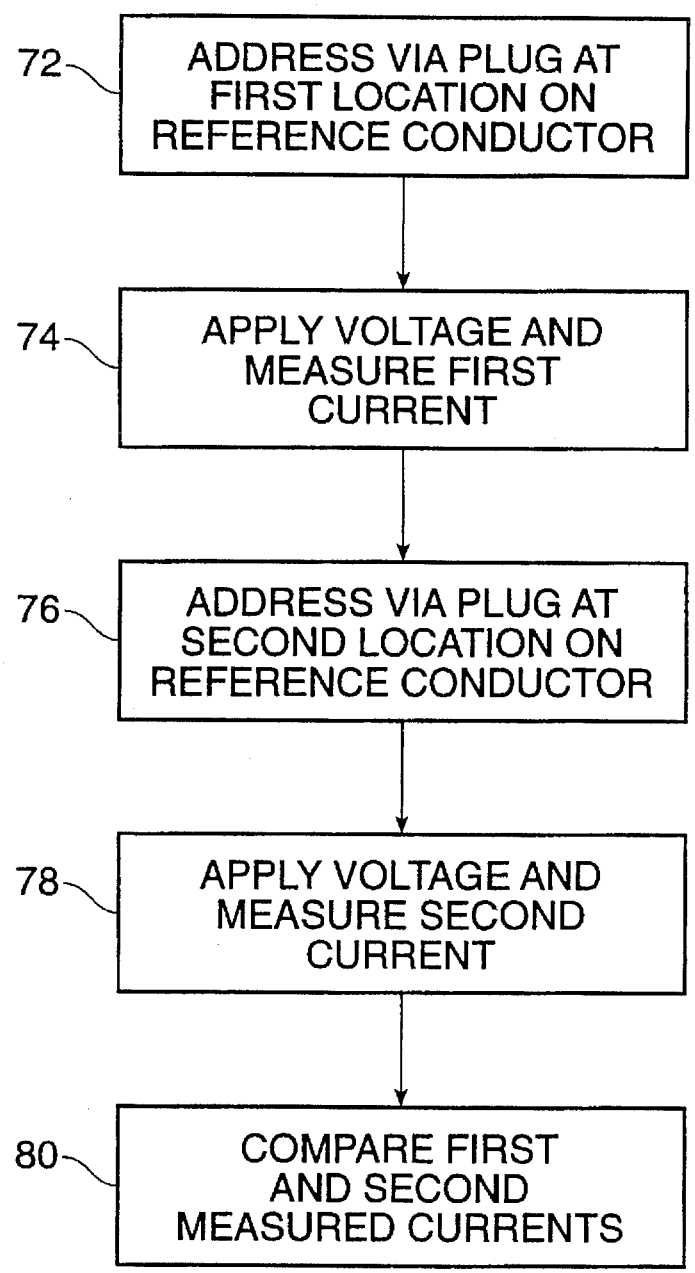
FIG. 3 is a flow diagram of a method for determining the resistance of a conductive line in an integrated circuit according to the present invention.

Referring now to FIG. 3, a flow diagram for the interconnect conductor resistance measurement method of the present invention is presented. First, at step 72, a first via plug at a first selected location on the reference conductor is addressed by turning on the appropriate ones of the programming transistors associated with it. Next, at step 74, voltage is applied to the circuit and the current passing through the first via plug is measured. At step 76, a second via plug at a selected location on the reference conductor is addressed by turning on the appropriate ones of the programming transistors associated with it. Then, at step 78, voltage is applied to the circuit and the current passing through the second via plug is measured. Finally, at step 80, the first and second measured currents are compared to determine the resistance of the portion of the reference conductor disposed between the first and second via plugs.

In some situations, the difference between the two measurements in adjacent rows described above may be too small to obtain an accurate measurement of the resistance of metal line segment 58. In such instances, the resistance of the entire length of measurement column conductor 40 can be obtained from the difference in measured resistance if both via plugs 44a and 44n are "programmed". If this total column line resistance is divided by the number of rows in the antifuse array 10, the resistance of segment 58 can be accurately determined.

Those of ordinary skill in the art will recognize that an array such as array 10 of FIG. 1 may contain different types of antifuses which may have different types of programming transistors associated with them. A measurement column conductor having circuit structures corresponding to each different antifuse structure and programming transistor combination can be provided to allow 100% resistance measurements to be made in the integrated circuit.

The ability to accurately determine antifuse resistance according to the present invention may be advantageously employed according to yet another aspect of the present invention. The decision to either employ additional soak cycles to reduce the antifuse resistance or to move on to program other antifuses can be based on a preset threshold resistance value.

From the foregoing description of the present invention, those of ordinary skill in the art will recognize that the apparatus and methods of the present invention also allow important data, such as antifuse resistance distribution versus programming current, to be obtained for numerous analytical purposes.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. An integrated circuit including a plurality of antifuses for selectively connecting together a plurality of interconnect conductors to provide programmed circuit paths for functional electronic circuits disposed on the integrated circuit, said integrated circuit further including:

programming circuit means comprising at least one of said interconnect conductors having an interconnect conductor resistance, one of said plurality of antifuses, and at least one programming transistor having an on-resistance, said programming circuit means for forming a programming series circuit between a first voltage potential node in said integrated circuit and a second voltage potential node in said integrated circuit;

reference circuit means comprising at least one reference conductor having a reference conductor resistance substantially equal to said interconnect conductor resistance, a via plug, and at least one reference transistor having an on-resistance substantially equal to the on resistance of said at least one programming transistor, said reference circuit means for forming a reference series circuit between said first and second voltage potential nodes; and programming circuit control means for selectively turning on said at least one programming transistor id response to signals identifying said one of said plurality of antifuses to create said programming series circuit and for selectively turning on said at least one reference transistor in response to signals identifying said via plug to create said reference series circuit.

2. An integrated circuit comprising:

at least one circuit structure including functional circuitry, interconnect conductors, antifuses formed in vias for selectively connecting inputs and outputs of the functional circuitry to one another through at least one of said interconnect conductors, and at least one programming transistor for selectively applying a programming voltage potential across said antifuses;

an antifuse resistance measurement structure electrically identical to said at least one circuit structure in which said antifuses are replaced by contact plugs in said visa;

an input pin on said integrated circuit for applying a programming voltage potential to said integrated circuit;

addressing circuitry for turning on selected ones of said programming transistors.

3. An integrated circuit comprising:

a first circuit node;

a second circuit node;

a first interconnect conductor;

a second interconnect conductor;

an antifuse connected between said first and second interconnect conductors;

at least one first programming transistor connected between said first circuit node and said first interconnect conductor;

at least one second programming transistor connected between said second circuit node and said second interconnect conductor;

a first reference conductor, said first reference conductor having substantially the same resistance as said first interconnect conductor;

a second reference conductor, said second reference conductor having substantially the same resistance as said second interconnect conductor;

a via plug connected between said first and second reference conductors;

at least one first reference transistor connected between said first circuit node and said first reference conductor, said at least one first reference transistor being substantially identical to said at least one first programming transistor;

at least one second reference transistor connected between said second circuit node and said second reference conductor, said at least one second reference transistor being substantially identical to said at least one second programming transistor;

addressing circuitry, connected to selectively turn on said at least one first and second programming transistors and to said at least one first and second reference transistors.

* * * * *

UNITED STATES PATENT AND TRADEMARK OFFICE
CERTIFICATE OF CORRECTION

PATENT NO. : 5,572,476
DATED : November 5, 1996
INVENTOR(S) : Abdelshafy A. Eltoukhy It is certified that error appears in the above-indentified patent and that said Letters Patent is hereby corrected as shown below:

Column 1, line 58, replace "oui" with --out--.
Column 6, line 51, after "will" insert --be--.
Colum 7, line 16, replace "an" with --art--.
Column 8, line 55, replace "id" with --in--.

Signed and Sealed this

Eighteenth Day of February, 1997

Attest:

BRUCE LEHMAN

*Attesting Officer*    *Commissioner of Patents and Trademarks*